(12) United States Patent
Nakao

(10) Patent No.: US 7,557,453 B2
(45) Date of Patent: Jul. 7, 2009

(54) SEMICONDUCTOR DEVICE, METHOD OF MANUFACTURING A SEMICONDUCTOR DEVICE AND SUBSTRATE TO BE USED TO MANUFACTURE A SEMICONDUCTOR DEVICE

(75) Inventor: Junichi Nakao, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 11/554,345

(22) Filed: Oct. 30, 2006

(65) Prior Publication Data
US 2007/0102813 A1 May 10, 2007

(30) Foreign Application Priority Data
Nov. 4, 2005 (JP) ............................. 2005-320536

(51) Int. Cl.
*H01L 23/48* (2006.01)
*H01L 23/52* (2006.01)

(52) U.S. Cl. ..................... 257/781; 257/750; 257/786; 257/773; 257/E23.041

(58) Field of Classification Search ................ 257/666, 257/750, 781, 784, E23.041, 786, 773
See application file for complete search history.

(56) References Cited

U.S. PATENT DOCUMENTS 6,812,552 B2 * 11/2004 Islam et al. .................. 257/666
2002/0179328 A1 * 12/2002 Sakai et al. .................. 174/260
2003/0141596 A1 * 7/2003 Nakamura et al. ........... 257/758
2005/0029588 A1 * 2/2005 Sakamoto et al. ............ 257/330

FOREIGN PATENT DOCUMENTS

| JP | 2001-251041 | 9/2001 |
| JP | 2002-9196 | 1/2002 |
| JP | 2002-359459 | 12/2002 |

\* cited by examiner

*Primary Examiner*—Nitin Parekh
(74) *Attorney, Agent, or Firm*—Oblon, Spivak, McClelland, Maier & Neustadt, P.C.

(57) ABSTRACT

A semiconductor device comprises a first electrode-lead having a first Au film, a first Ni film, a Cu film, a second Au film and a second Ni film stacked in order, a second electrode-lead having a first Au film, a first Ni film, a Cu film, a second Au film and a second Ni film stacked in order and a semiconductor chip having a first electrode formed on a first surface of the semiconductor chip and a second electrode formed on a second surface of the semiconductor chip, the first electrode being formed on an opposite side of the second electrode. The semiconductor chip mounted on the first electrode-lead, the second electrode facing the first surface of the first electrode-lead. A first connection conductor is connected the first electrode of the semiconductor chip to the first surface of the second electrode-lead. The first electrode-lead, the second electrode-lead and the semiconductor chip are housed in a package. The second surface of the first electrode-lead and the second surface of the second electrode-lead are exposed at a surface of the package.

12 Claims, 13 Drawing Sheets

SEMICONDUCTOR DEVICE, METHOD OF MANUFACTURING A SEMICONDUCTOR DEVICE AND SUBSTRATE TO BE USED TO MANUFACTURE A SEMICONDUCTOR DEVICE

CROSS REFERENCE TO RELATED APPLICATION

This application is based upon and claims the benefit of priority from the prior Japanese Patent Application No. 2005-320536, filed on Nov. 4, 2005, the entire contents of which are incorporated herein by reference.

FIELD OF THE INVENTION

The present invention relates to a semiconductor device, a method of manufacturing a semiconductor device, and a substrate to be used to manufacture a semiconductor device.

DESCRIPTION OF THE BACKGROUND

Recently, as a small electronic equipment such as a cellular phone or a portable communication terminal is widely used, a surface-mount-type package capable of soldering an electrode-lead directly with a substrate has become popular in a semiconductor device of a resin-sealed type.

Conventionally, it is well known to mount a semiconductor chic on an upper surface of an electrode-lead to which an Au film, a Ni film, and a Au film are stacked in order. The semiconductor chip is connected to another electrode-lead. The electrode-leads and the semiconductor chip are housed in a package molded out of a resin. A lower surface of the electrode lead is exposed at a surface of the package.

However, in this semiconductor device, there is a problem in that radiation performance of a heat generated in the semiconductor chip is poor because thermal conductivity of Ni of the electrode-lead is low.

A printed wiring board having a Cu film, a Ni film and an Au film stacked on a board is proposed in Japanese Patent Application (Koukai) No. 2002-359459 (Corresponding to U.S. Patent Application (published) No. US2002/0179328A1). In this printed wiring board, the Ni plating film is formed on a surface of the Cu foil which has a wiring pattern, and the Au plating film is formed on a surface of the Ni plating film.

Another printed wiring board is proposed in Japanese Patent Application (Koukai) No. 2001-251041. In this printed wiring board, a Cu plating film which has a wiring pattern is formed on both surfaces of an electric insulating board. A Ni plating film is formed on the Cu plating film. An Au plating film is formed on the Ni plating film.

However, the above-mentioned printed wiring boards are directed to boards to mount electronic parts housed in a package, for instance, and the references do not disclose a way to house the semiconductor chip in the package of the surface mount type.

SUMMARY OF THE INVENTION

One aspect of the invention is to provide a semiconductor device including, a first electrode-lead having a first Au film, a first Ni film, a Cu film, a second Au film and a second Ni film stacked in order, the first electrode-lead having a first surface and a second surface on opposite sides, a second electrode-lead having a first Au film, a first Ni film, a Cu film, a second Au film and a second Ni film stacked in order, the second electrode-lead disposed apart from the first electrode-lead, the second electrode-lead having a first surface and a second surface on opposite sides, a semiconductor chip having a first electrode formed on a first surface of the semiconductor chip and a second electrode formed on a second surface of the semiconductor chip, the first electrode being formed on an opposite side of the second electrode, the semiconductor chip mounted on the first electrode-lead, the second electrode facing the first surface of the first electrode-lead, a first connection conductor connecting the first electrode of the semiconductor chip to the first surface of the second electrode-lead, and a package housing the first electrode-lead, the second electrode-lead and the semiconductor chip, the second surface of the first electrode-lead and the second surface of the second electrode-lead being exposed at a surface of the package.

Another aspect of the invention is to provide a method of manufacturing a semiconductor device including, preparing a first electrode-lead and a second electrode-lead apart on a surface of a board, the first electrode-lead and the second electrode-lead having a high thermal conductivity, mounting a semiconductor chip on a first surface of the first electrode-lead, the semiconductor chip having a first electrode formed on a first surface of the semiconductor chip and a second electrode opposed to the first electrode formed on a second surface of the semiconductor chip, connecting the second electrode of the semiconductor chip to a first surface of the second electrode-lead, packaging the first electrode-lead, the second electrode-lead and the semiconductor chip, and separating the board from the first electrode-lead and the second electrode-lead.

Another aspect of the invention is to provide a substrate to be used to manufacture a semiconductor device including, a board and a plurality of electrode-leads formed separately on a surface of the board, the plurality of electrode-leads having a first Au film, a first Ni film, a Cu film, a second Au film and a second Ni film stacked in order.

DETAILED DESCRIPTION OF THE INVENTION

Embodiments of the present invention will be described below in detail with reference to the drawings mentioned above.

A semiconductor device of a first embodiment according to the present invention is hereinafter explained in detail with reference to FIGS. 1A, 1B and 2.

Figure 1A:
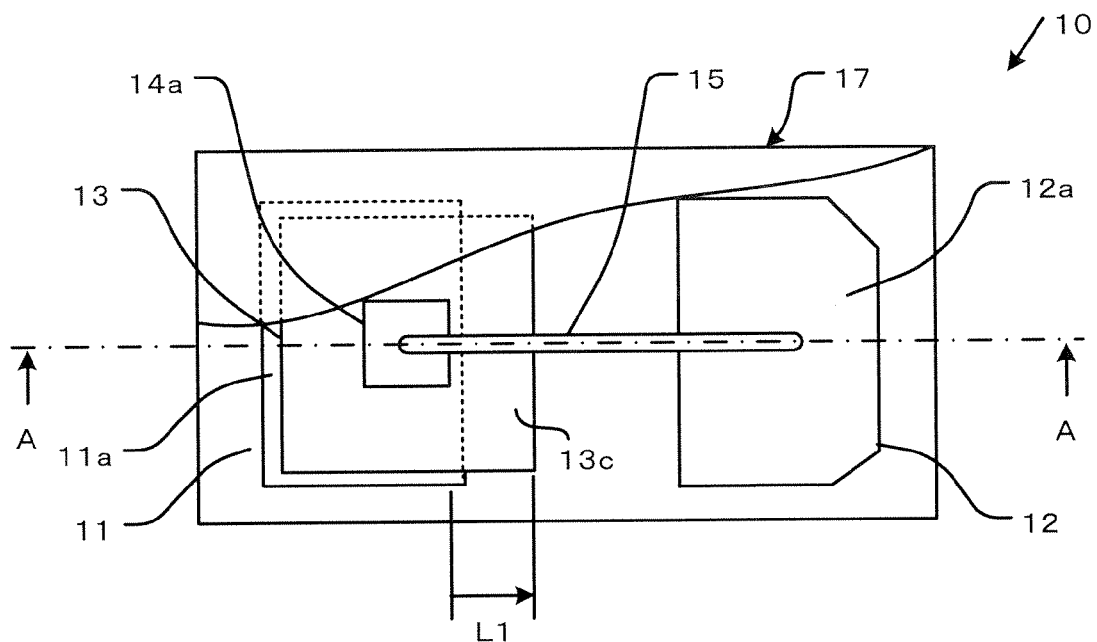
FIG. 1A shows a partially cutaway plain view of a semiconductor device according to a first embodiment of the present invention.
Figure 1B:
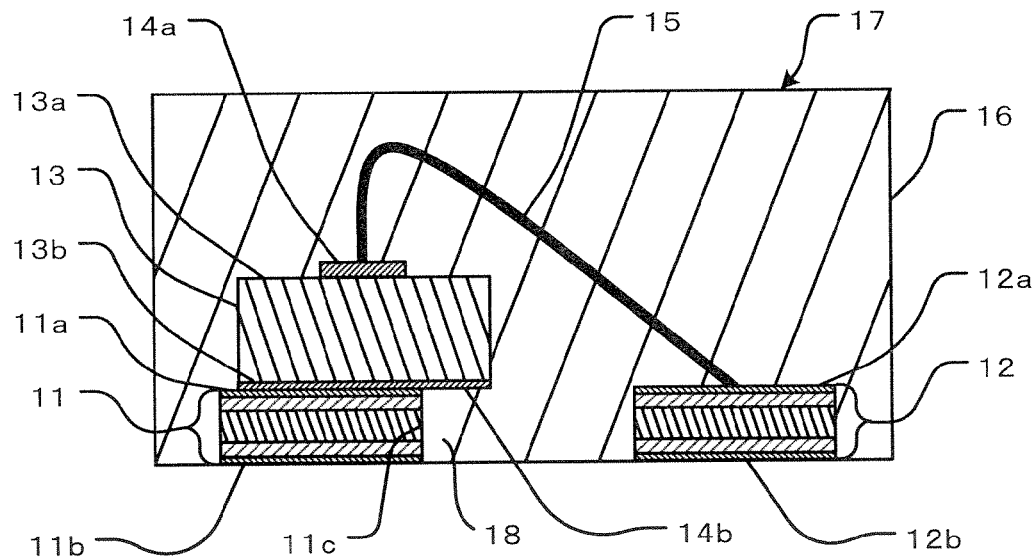
FIG. 1B shows a cross sectional view along line A-A of FIG. 1A.

As shown in FIGS. 1A and 1B, a semiconductor device 10 includes a semiconductor chip 13 housed in a package 17. In one embodiment, the semiconductor chip 13 may be a silicon p-n junction diode. A first electrode-lead 11 having a first Au film, a first Ni film, a Cu film, a second Au film and a second Ni film stacked in order, and a second electrode-lead 12 having a first Au film, a first Ni film, a Cu film, a second Au film and a second Ni film stacked in order. The second electrode-lead 12 is disposed apart from the first electrode-lead 11.

The semiconductor chip 13 have a first electrode 14a formed on a first surface 13a of the semiconductor chip 13 and a second electrode 14b formed on a second surface 13b of the semiconductor chip 13. The first electrode 14a is disposed on the opposite side to the second electrode 14b of the semiconductor chip 13. The semiconductor chip 13 is mounted on a first surface 11a of the first electrode-lead 11.

The first electrode 14a of the semiconductor chip 13 is connected to a first surface 12a of the second electrode-lead 12 via a first connection conductor 15. The first electrode-lead 11, the second electrode-lead 12 and the semiconductor chip 13 are housed in the package 17. In one exemplary embodiment, the package 17 is molded out of a resin 16. A second surface 11b located opposed to the first surface 11a of the first electrode-lead 11 and a second surface 12b located opposed to the first surface 12a of the second electrode-lead 12 are exposed at the surface of the package 17. The meaning of the word "exposed" is that the second surface 11b of the first electrode-lead 11 and the second surface 12b of the second electrode-lead 12 can be connected electrically to outside terminals, for example bumps, at the surface of the package 17.

In this embodiment, a part 13c of the semiconductor chip 13 protrudes from the first electrode-lead 11 toward the second electrode-lead 12 by a length L1. As a result, a part 18 of the resin 16 enters under the part 13c of the semiconductor chip 13. The resin 16 improves adhesion of the resin 16, the first electrode-lead 11, the second electrode-lead 12 and the semiconductor chip 13 by an anchoring effect of the part 18 of the resin 16.

Figure 2:
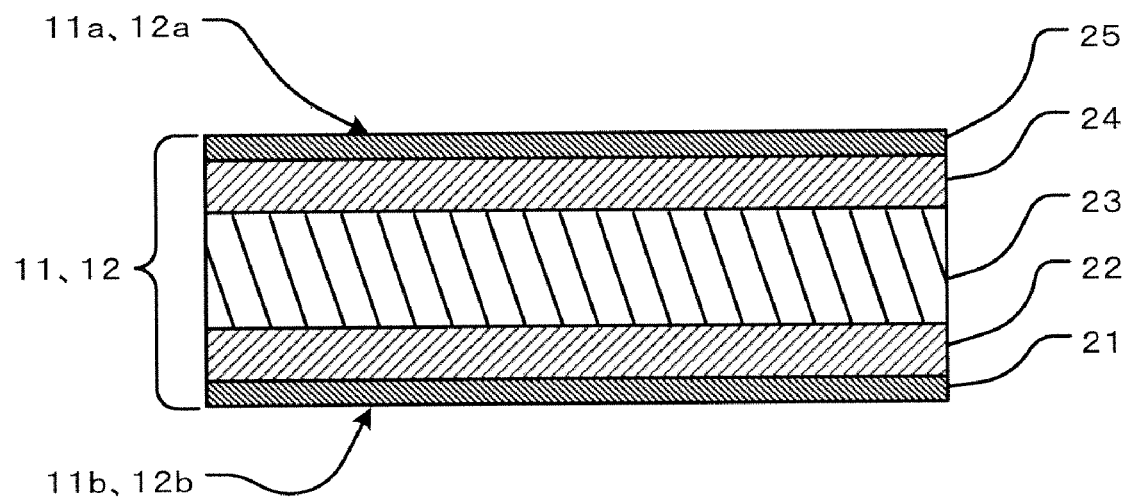
FIG. 2 shows an enlarged cross sectional view of an electrode-lead along line A-A of FIG. 1A.

As shown in FIG. 2, each of the first electro-lead 11 and the second electro-lead 12 has the first Au film 21, the first Ni film 22, the Cu film 23, the second Au film 24 and the second Ni film 25 stacked in order from the second surface 11b and 12b to the first surface 11a, 12a. The Cu film 23 is a main composition material of the first electro-lead 11 and the second electro-lead 12. In one embodiment, a quantity of the Cu film 23 is more than 50% in weight. A heat generated in the semiconductor chip 13 is radiated outside easily because a thermal conductivity of the Cu film 23 is high (about 394 W/mK).

The first Au film 21 and the second Au film 25 prevent an oxidation of the Cu film 23. The Au film 21 makes it easy to solder the semiconductor device 10 to an outer board (not illustrated). The second Au film 25 makes it easy to bond the first connection conductor 15 on the first surface 12a of the second electrode-lead 12.

The first Ni film 22 and the second Ni film 24 work as a barrier layer to prevent the first Au film 21 and the second Au film 22 with the Cu film 23 from alloying by thermal diffusion during bonding and mounting. Then, a failure of bonding and a failure of mounting may be prevented.

In one embodiment, it may be suitable to set the thickness of the first Au film 21 and the thickness of the second Au film 25 within a range from about 0.2 μm to 2 μm, the thickness of the first Ni film 22 and the thickness of the second Ni film 24 within a range from about 1 μm to 5 μm respectively and the thickness of the Cu film 23 is within a range from about 10 μm to 50 μm.

A lot of the heat generated in the semiconductor chip 13 is radiated outside through the Cu film 23 of the first electrode-lead 11. A part of the heat generated in the semiconductor chip 13 is radiated outside through the first connection conductor 15, the Cu film 23 and the second electrode-lead 12. Then, a sufficient radiation performance of the heat generated in the semiconductor chip 13 may be obtained.

A thermal conductivity of Cu (about 394 W/mK) is larger than a thermal conductivity of Au (about 317 W/mK) and a thermal conductivity of Ni (about 92 W/mK). A specific heat of Cu (about 0.385 J/gK) is larger than a specific heat of Au (about 0.128 J/gK), is close to a specific heat of Ni (about 0.439 J/gK), and is comparatively large.

As a result, a volume of the Cu film 23 increases by the thickness of the Cu film 23 thick. A heat capacity of Cu film 23 increases in proportion to the volume of the Cu film 23. The heat locally generated in the semiconductor chip 13 is quickly absorbed in the Cu film 23 and diffused. The heat absorbed and diffused in the Cu film 23 is efficiently radiated outside without concentrating on one part via the Ni film 22 and the Au film 21.

A junction temperature of the silicon diode may decrease about 20% to 30% compared with a conventional one. The junction temperature is determined that a predetermined rectangular forward current is applied to the silicon diode and the reverse current of the silicon diode is measured during the off period of the forward current.

Next, a method of manufacturing the semiconductor device in accordance with the first embodiment of the present invention will be explained with references from FIG. 3 to FIG. 10. Cross sectional views of the semiconductor device manufactured according to each stage of the first embodiment of the method in accordance with the present invention are shown from FIG. 3 to FIG. 9. FIG. 10 shows a cross sectional view of the semiconductor device mounted on a printed wiring board with a solder according to the first embodiment of the invention.

Figure 3:
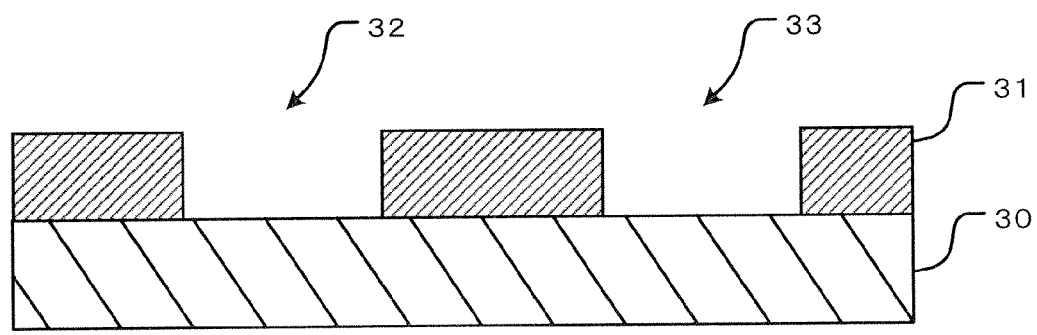
FIG. 3 shows a cross sectional view of the semiconductor device at a first manufacturing stage of a method in accordance with a first embodiment of the present invention.

First, as shown in FIG. 3, a mask film 31 is formed on an electrical conductive board 30. For example, the mask film 31 is a resist film and the electrical conductive board 30 is a stainless steel board having a thickness of 150 μm. A first through hole 32 and a second through hole 33 are formed to the mask film 31 by a photolithography method for forming the first electrode-lead 11 and the second electrode-lead 12. A thickness of the mask film 31 is determined to be substantially equal to a sum of the thickness of the first Au film 21, the first Ni film 22, the Cu film 23, the second Ni film 24 and the second Au film 25. For example, the sum of the thickness may be about 30 μm to 40 μm.

Figure 4A:
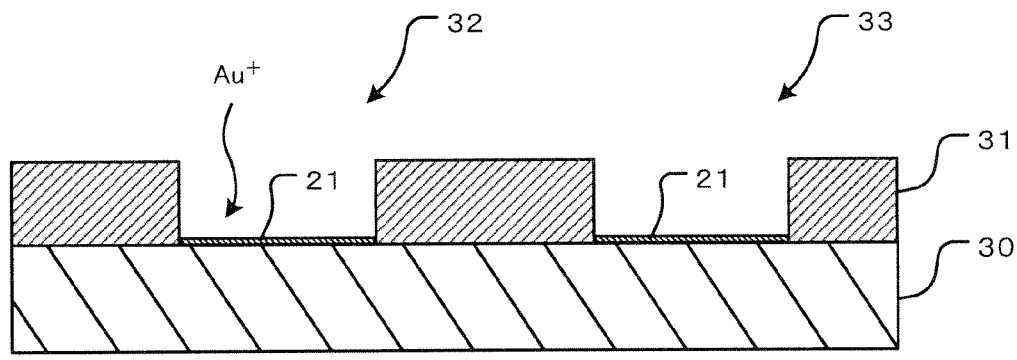
FIGS. 4A, 4B and 4C show cross sectional views of the semiconductor device at a second manufacturing stage of the method.
Figure 4B:
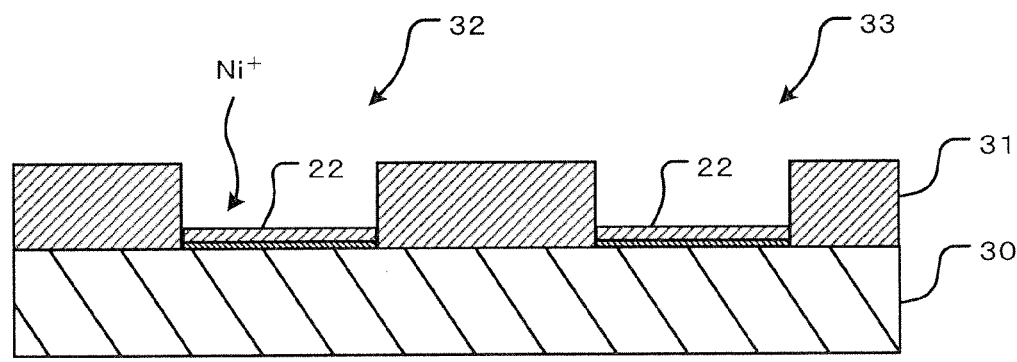
Figure 4C:
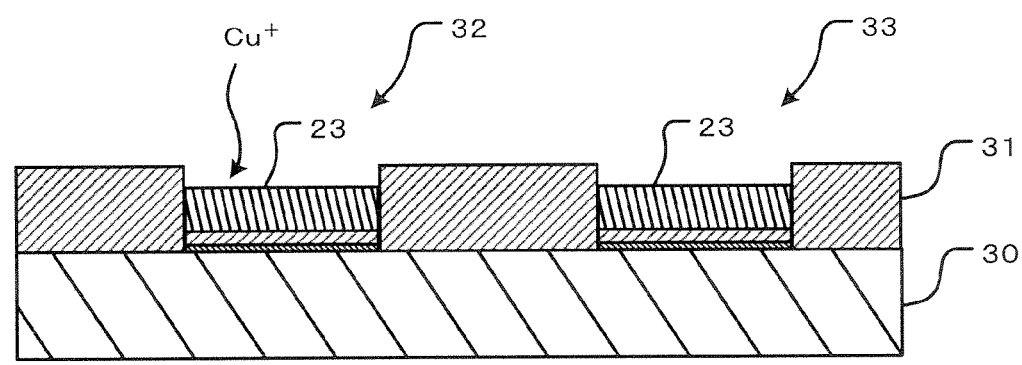

As shown in FIG. 4A, two first Au film 21 having a thickness of 0.2 μm to 2 μm are formed on the electrical conductive board 30 exposed to a bottom of the first through hole 32 and the second through hole 33 by a electrolytic plating. As shown in FIG. 4B, two first Ni film 22 having a thickness of 1 μm to 5 μm are formed on the first Au film 21 exposed to the bottom of the first through hole 32 and the second through hole 33 by the electrolytic plating. As shown in FIG. 4C, two Cu film 23 having a thickness of 10 μm to 50 μm are formed on the first Ni film 22 exposed to the bottom of the first through hole 32 and the second through hole 33 by the electrolytic plating.

Figure 5A:
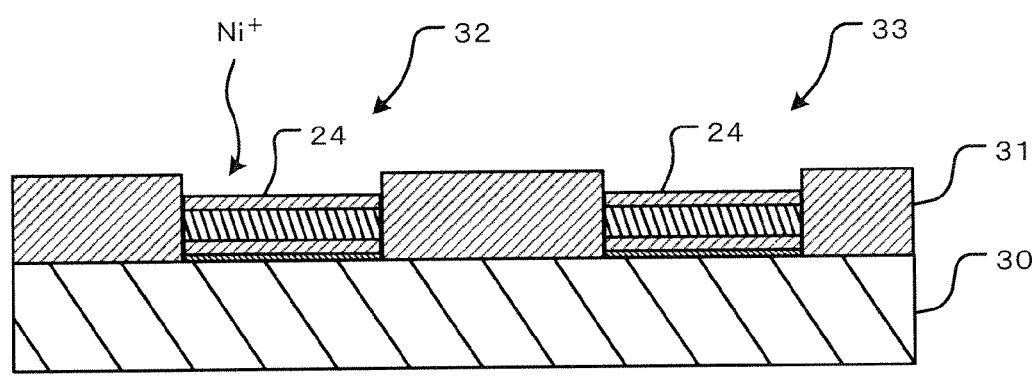
FIGS. 5A and 5B show cross sectional views of the semiconductor device at a third manufacturing stage of the method.
Figure 5B:
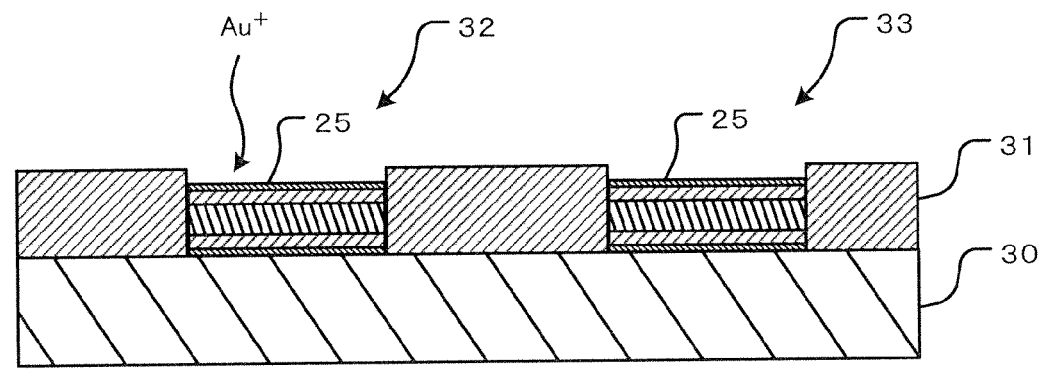

As shown in FIG. 5A, two second Ni film 24 having a thickness of 1 μm to 5 μm are formed on the Cu film 23 exposed to the bottom of the first through hole 32 and the second through hole 33 by the electrolytic plating. As shown in FIG. 5B, two second Au film 25 having a thickness of 0.2 μm to 2 μm are formed on the second Ni film 24 exposed to the bottom of the first through hole 32 and the second through hole 33 by the electrolytic plating.

Figure 6:
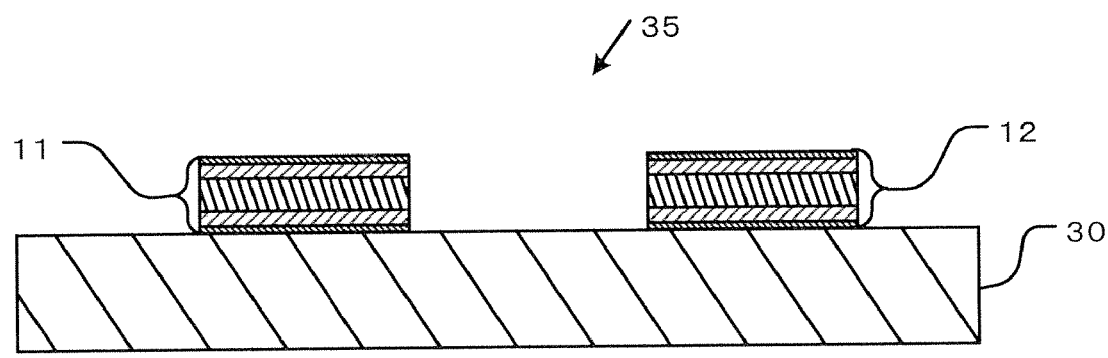
FIG. 6 shows a cross sectional view of the semiconductor device at a forth manufacturing stage of the method.

As shown in FIG. 6, by removing the mask film 31, a substrate 35 to be used to manufacture the semiconductor device 10 is obtained. The semiconductor device 10 includes the first electrode-lead 11 and the second electrode-lead 12 having the first Au film 21, the first Ni film 22, the Cu film 23, the second Au film 24 and the second Ni film 25 stacked in order respectively formed on the surface of the board 30 and disposed each other apart.

Figure 7:
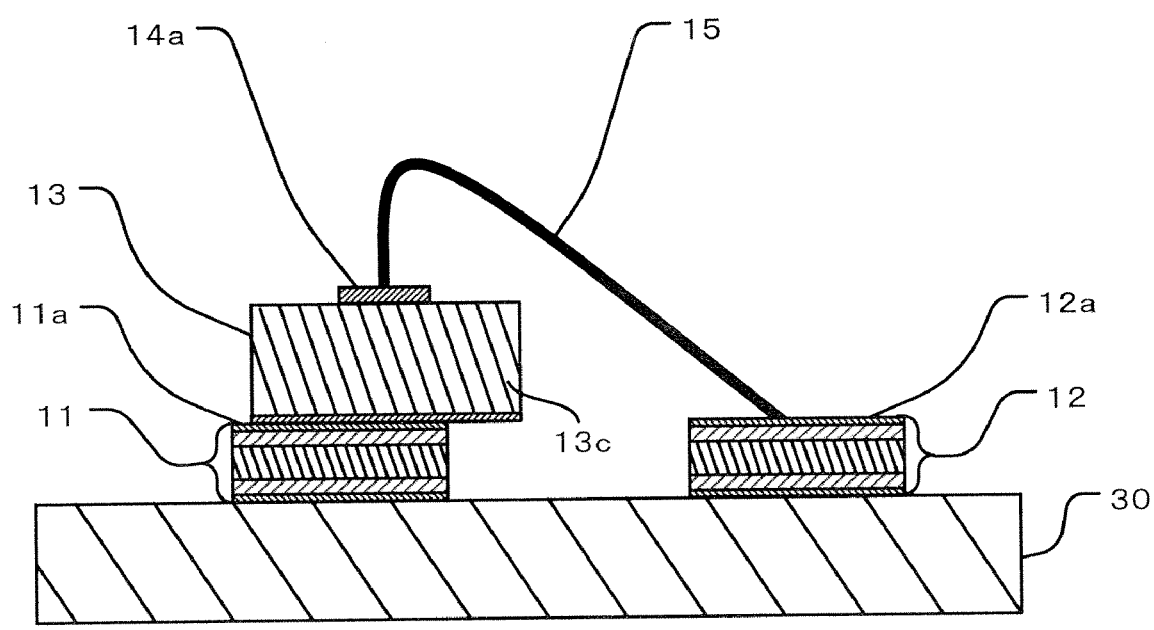
FIG. 7 shows a cross sectional view of the semiconductor device at a fifth manufacturing stage of the method.

As shown in FIG. 7, the semiconductor chip 13 is mounted on the first surface 11a of the first electrode-lead 11 by an electrically conductive adhesive (not illustrated in FIG. 7). The part 13c of the semiconductor chip 13 protrudes from the first electrode-lead 11 toward the second electrode-lead 12. The first electrode 14a of the semiconductor chip 13 is connected to the first surface 12a of the second electrode-lead 12 via the first connection conductor 15.

Figure 8:
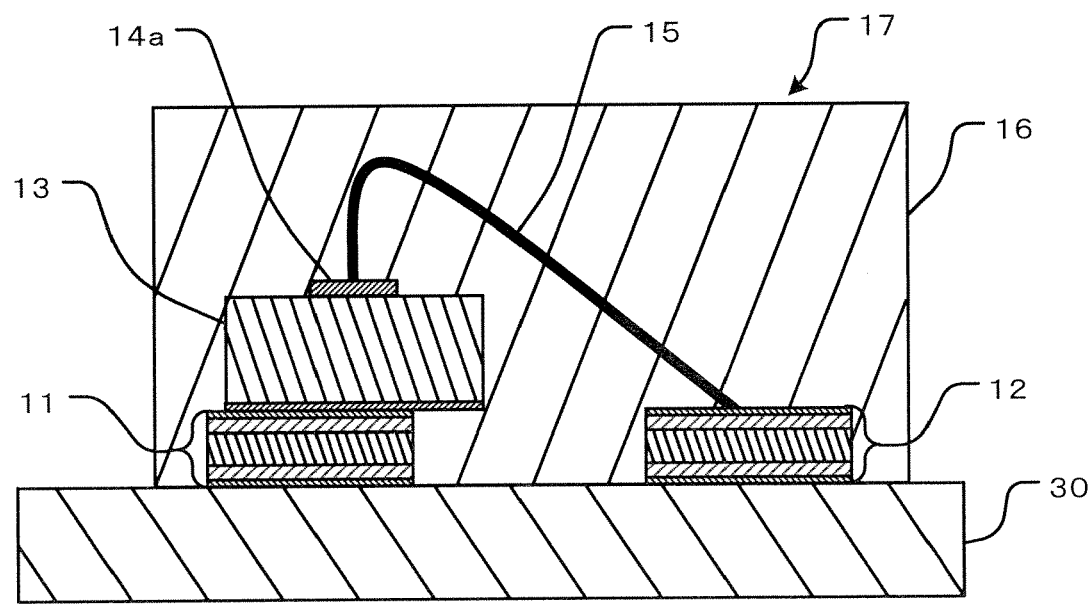
FIG. 8 shows a cross sectional view of the semiconductor device at a sixth manufacturing stage of the method.

As shown in FIG. 8, The first electrode-lead 11, the second electrode-lead 12, the semiconductor chip 13 and the first connection conductor 15 are sealed with the resin 16. Then, a package 17 molded out of the resin 16 to house the first electrode-lead 11, the second electrode-lead 12, the semiconductor chip 13 and the first connection conductor 15 is obtained.

Figure 9:
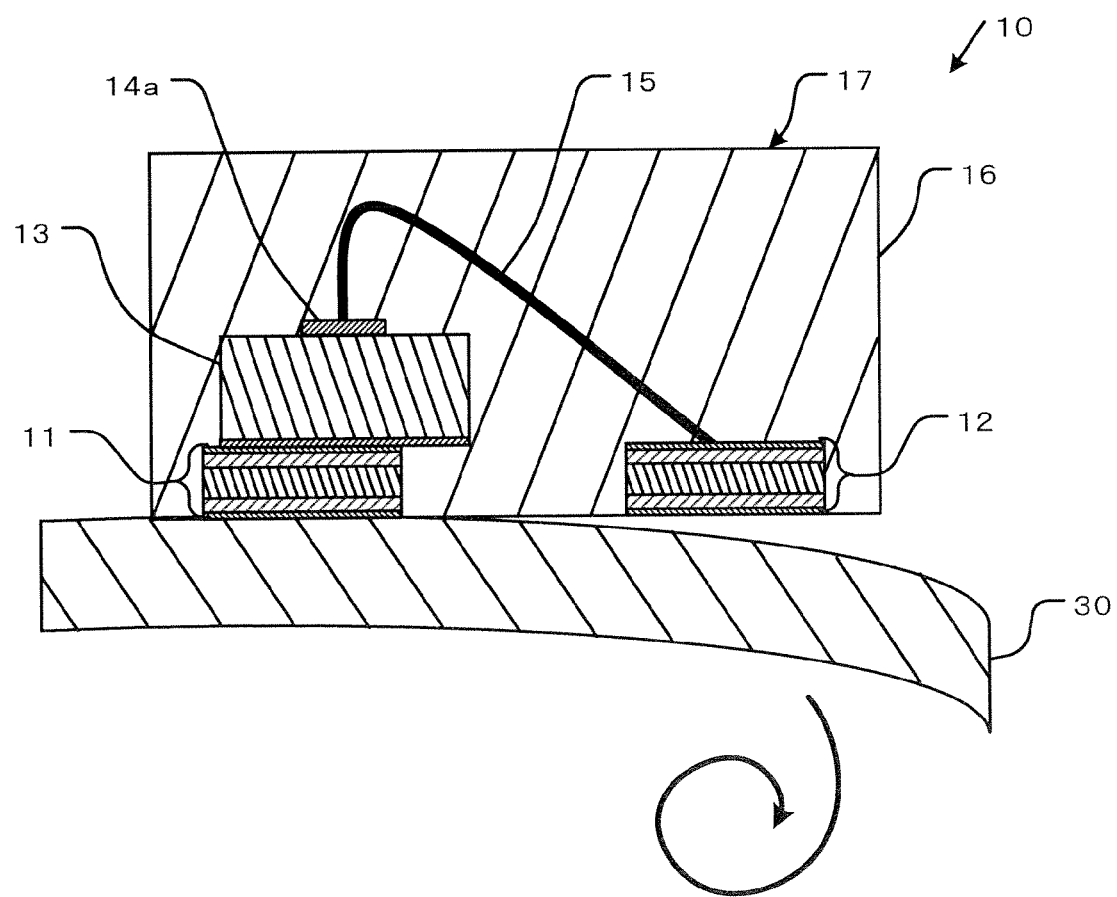
FIG. 9 shows a cross sectional view of the semiconductor device at a seventh manufacturing stage of the method.
Figure 10:
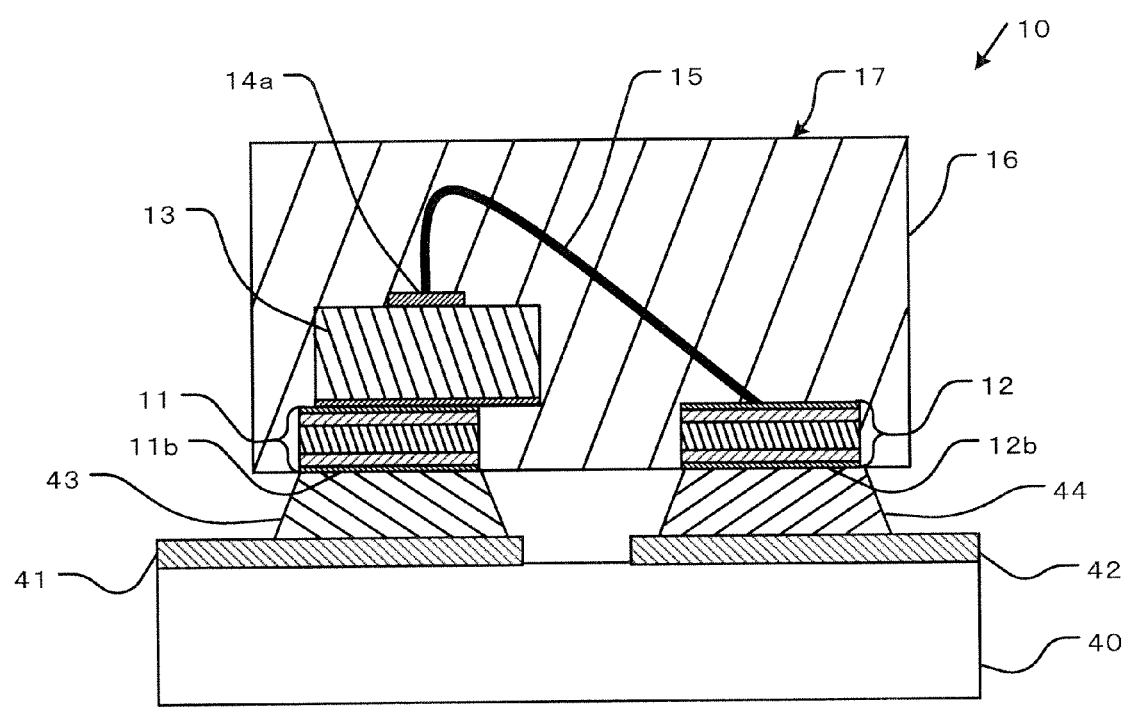
FIG. 10 shows a cross sectional view of the semiconductor device mounted on a printed wiring board with a solder according to the first embodiment of the present invention.

As shown in FIG. 9, the package 17 molded out of the resin 16 is adsorbed and fixed, and the board 30 may be stripped, for example, by winding. Finally, the semiconductor device 10 shown in FIG. 1 is obtained in which the second surface of the first electrode-lead 11 and the second surface of the second electrode-lead 12 are exposed at the surface of the package 17.

As shown in FIG. 10, a printed wiring board 40 includes a wiring pattern 41 and a wiring pattern 42 formed on the printed wiring board 40. A connection terminal 43 is formed to one end side of the wiring pattern 41. Another connection terminal 44 is formed to another end side of the wiring pattern 42. The semiconductor device 10 is put on the printed wiring board 40 so that the connection terminal 43 touches the second surface 11b of the first electro-lead 11 and the connection terminal 44 touches the second surface 12b of the second electro-lead 12.

The printed wiring board 40 is for example a glass epoxy board. The wiring pattern 41 and the wiring pattern 42 are for example a 100 μm thick Cu foil bonded on the board 40 with a 20 μm thick adhesive. The connection terminal 43 and the connection terminal 44 are for example 100 μm square solders. The electrode-lead 11 and the electrode-lead 12 are soldered with the connection terminal 43 and the connection terminal 44 by putting and heating the semiconductor device 10 on the printed wiring board 40. Then the semiconductor device 10 is mounted on the printed wiring board 40.

Figure 11:
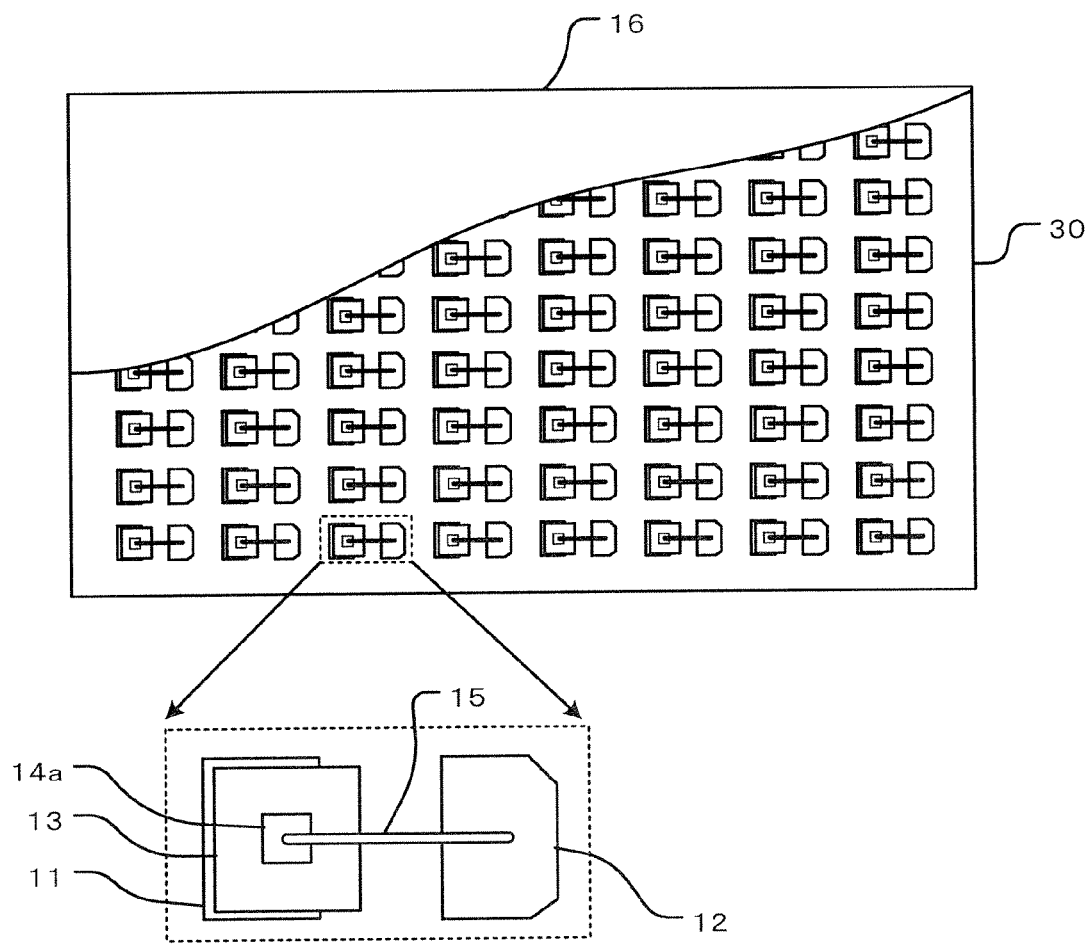
FIG. 11 shows a partially cutaway plain view of a plurality of the semiconductor devices manufactured in bulk using a wide substrate like a sheet according to the first embodiment of the present invention.
Figure 12:
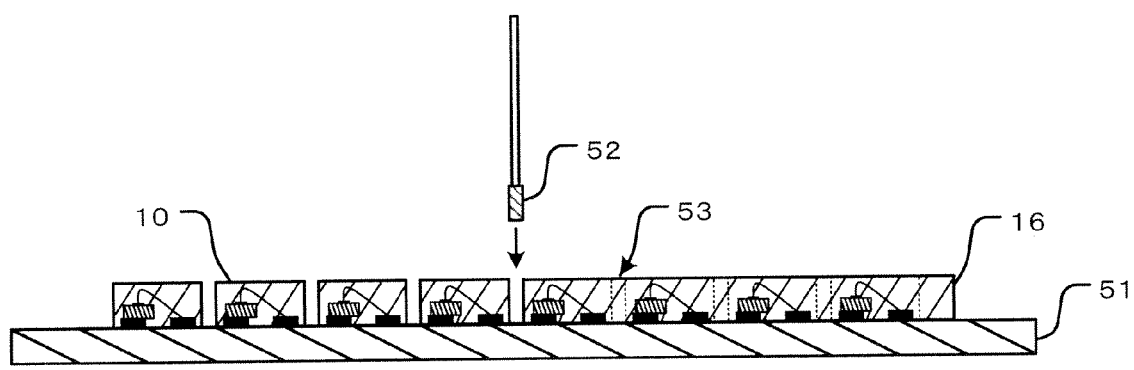
FIG. 12 shows a cross sectional view of the plurality of the semiconductor devices separated into an individual semiconductor device by dicing according to the first embodiment of the present invention.

FIG. 11 shows a partially cutaway plain view of a plurality of the semiconductor devices manufactured in bulk using a wide substrate like a sheet according to the first embodiment of the present invention. FIG. 12 shows a cross sectional view of the plurality of the semiconductor devices to be separated to an individual semiconductor device by a dicing according to the first embodiment of the present invention.

As shown in FIG. 11, a plurality of the first electrode-lead 11 and a plurality of the second electrode-lead 12 which are disposed apart are formed on the board 30 in bulk by the electrolytic plating. The board 30 is for example an about 50 mm square. Each of the semiconductor chips 13 is mounted on the first surface of each of the first electrode-leads 11. The first electrode 14a of each of the semiconductor chips 13 is connected to the first surface of each of the second electrode-leads 12 via the first connection conductor 15. The semiconductor chips 13, the first connection conductors 15, the first electrode-leads 11 and the second electrode-leads 12 are sealed with the resin 16 in bulk. Then, several thousand semiconductor devices 10 are formed in bulk.

As shown in FIG. 12, after separating the board 30 from the first electrode-leads 11 and the second electro-leads 12, the resin 16 is put on an adhesive sheet 51 and is cut by a blade 52 along a dicing area 53.

The semiconductor device 10 in accordance with the above embodiment includes the first electrode-lead 11 and the second electrode-lead 12 which have the first Au film 21, the first Ni film 22, the Cu film 23, the second Au film 24 and the second Ni film 25 stacked in order. Then, the heat generated in the semiconductor chip 13 is radiated outside via the Cu film 23. As a result, small semiconductor device 10 being 0.8 mm long, 0.4 mm wide and 0.4 mm high is obtained with the sufficient heat radiation performance.

It is explained that the board 30 may be a stainless steel board which is easy to separate from the first electrode-lead 11 and the second electrode-lead 12 formed by the electrolytic plating. But it may be possible to use boards made by other suitable metal. It is explained that the first electrode-lead 11 and the second electrode-lead 12 are formed by the electrolytic plating. But the first electrode-lead 11 and the second electrode-lead 12 may be formed by non-electrolytic plating. In the non-electrolytic plating, a flexible insulating film, for example a polyimide, may be used as the board 30.

However, when the thickness of the first electrode-lead 11 and the thickness of the second electrode-lead 12 are thick, the electrolytic plating with large plating speed may be more desirable than the non-electrolytic plating in a viewpoint of processing time and cost.

It is explained that the first electrode-lead 11 and the second electrode-lead 12 are formed by the plating. But the first electrode-lead 11 and the second electrode-lead 12 may be formed by another method, for example, by sputtering or vacuum evaporation within a range where a target thickness is obtained.

A semiconductor device of a second embodiment according to the invention is hereinafter explained with reference to FIGS. 13A and 13B. With respect to each portion of the second embodiment, the same portion of the first embodiment shown in FIGS. 1A and 1B is designated by the same reference numeral.

The second embodiment differs from the first embodiment in that a semiconductor device includes a third electrode-lead.

Figure 13A:
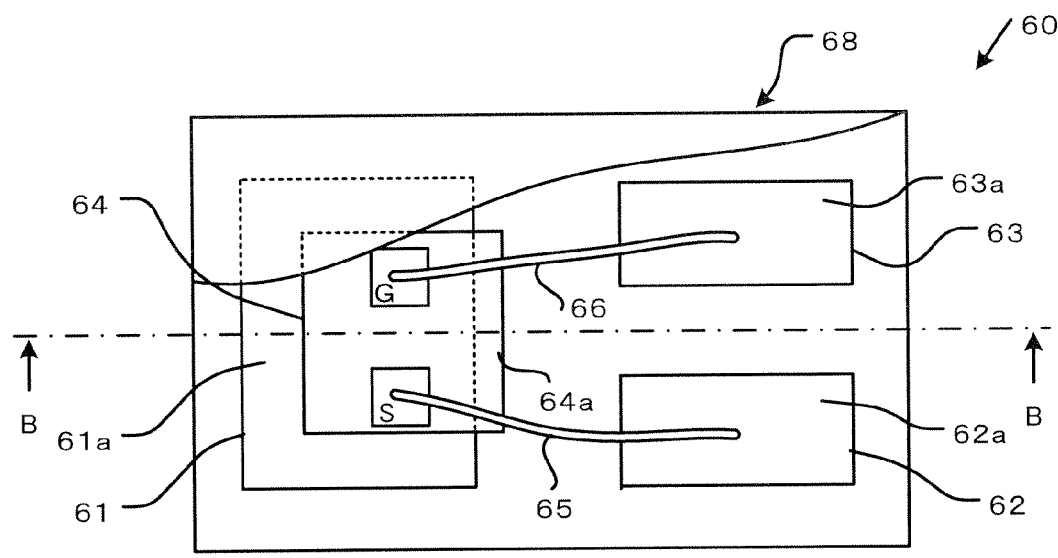
FIG. 13A shows a partially cutaway plain view of a semiconductor device according to a second embodiment of the present invention.
Figure 13B:
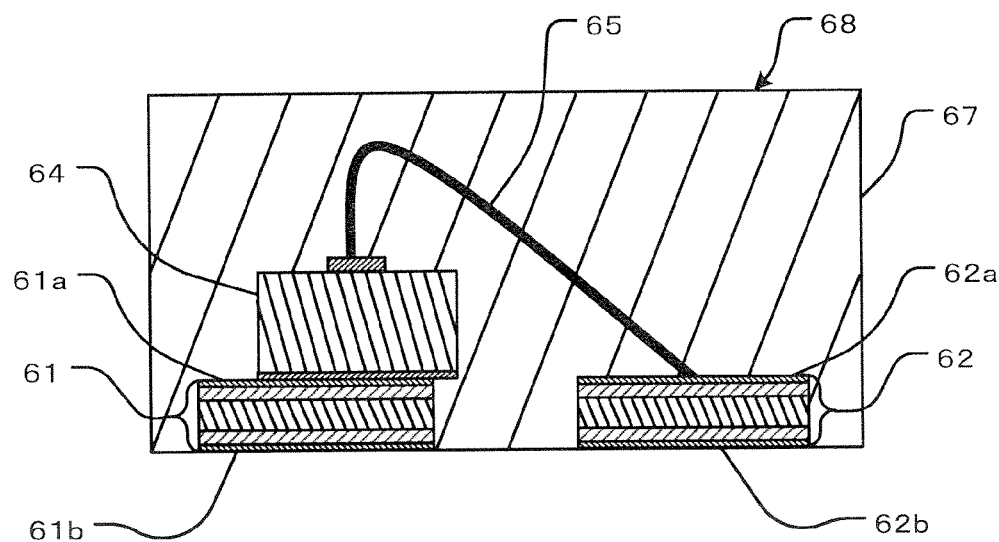
FIG. 13B shows a cross sectional view along line B-B of FIG. 13A.

As shown in FIGS. 13A and 13B, the semiconductor device 60 includes a first electrode-lead 61, a second electrode-lead 62 and a third electrode-lead 63. The second electrode-lead 62 and the third electrode-lead 63 are disposed apart against the first electrode-lead 61.

A semiconductor chip 64, for example a lateral metal-oxide semiconductor field effect transistor is mounted on a first surface 61a of the first electrode-lead 61. A part 64a of the semiconductor chip 64 protrudes from the first electrode-lead 61 toward the second electrode-lead 62 and the third electrode-lead 63.

A first electrode S of the semiconductor chip 64 is connected to a first surface 62a of the second electrode-lead 62 via a first connection conductor 65. A third electrode G of the semiconductor chip 64 is connected to a first surface 63a of the third electrode-lead 63 via a second connection conductor 66.

The first electrode-lead 61, the second electrode-lead 62, the third electrode-lead 63, the semiconductor chip 64, the first connection conductor 65 and the second connection conductor 66 are housed in a package 68 molded out of a resin 67. A second surface 61b of the first electrode-lead 61, a second surface 62b of the second electrode-lead 62 and a second surface (not illustrated in FIGS. 13A and 13B) of the third electrode-lead 63 are exposed at a surface of the package 68.

A lot of a heat generated in the semiconductor chip 64 radiate outside via the Cu film 23 of the first electrode-lead 61. A part of the heat generated in the semiconductor chip 64 radiate outside via the first connection conductor 65, the second connection conductor 66, the Cu film 23 of the second electrode-lead 62 and the Cu film 23 of the third electrode-lead 63. Then, it is possible that a sufficient heat radiation performance is obtained.

The semiconductor device 60 of the second embodiment has an advantage that a heat radiation performance of a semiconductor chip that generates more heat, for example a transistor, is increased because of the second electrode-lead 62 and the third electrode-lead 63.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   a first electrode-lead having a first Au film, a first Ni film, a Cu film, a second Au film and a second Ni film stacked in order, the first electrode-lead having a first surface and a second surface on opposite sides;
   a second electrode-lead having a first Au film, a first Ni film, a Cu film, a second Au film and a second Ni film stacked in order, the second electrode-lead disposed apart from the first electrode-lead, the second electrode-lead having a first surface and a second surface on opposite sides;
   a semiconductor chip having a first electrode formed on a first surface of the semiconductor chip and a second electrode formed on a second surface of the semiconductor chip, the first electrode being formed on an opposite side of the second electrode, the semiconductor chip mounted on the first electrode-lead, the second electrode facing the first surface of the first electrode-lead;
   a first connection conductor connecting the first electrode of the semiconductor chip to the first surface of the second electrode-lead; and
   a package housing the first electrode-lead, the second electrode-lead and the semiconductor chip, the second surface of the first electrode-lead and the second surface of the second electrode-lead being exposed at a surface of the package.

2. The semiconductor device according to claim 1, wherein in each of the first electrode-lead and the second electrode-lead, a thickness of the Cu film is larger than a combined thickness of the first Au film, the first Ni film, the second Au film and the second Ni film.

3. The semiconductor device according to claim 2, wherein the thickness of the Cu film is within a range from about 10 µm to 50 µm, the thickness of the first Au film and the thickness of the second Au film are within a range from about 0.2 µm to 2 µm, and the thickness of the first Ni film and the thickness of the second Ni film are within a range from about 1 µm to 5 µm.

4. The semiconductor device according to claim 1, wherein a part of the semiconductor chip protrudes from the first electrode-lead.

5. The semiconductor device according to claim 4, wherein the part of the semiconductor chip laterally protrudes from the first electrode-lead toward the second electrode-lead.

6. The semiconductor device according to claim 1, wherein the semiconductor chip is a diode.

7. The semiconductor device according to claim 1 further comprising:
   a third electrode-lead having a first Au film, a first Ni film, a Cu film, a second Au film and a second Ni film stacked in order, the third electrode-lead disposed apart from the first electrode-lead and the second electrode-lead;
   a third electrode formed on the first surface of the semiconductor chip, the third electrode having a first surface and a second surface on opposite sides, the third electrode disposed apart from the second electrode; and
   a second connection conductor connecting the third electrode of the semiconductor chip to the first surface of the third electrode-lead, the second surface of the third electrode-lead being exposed at the surface of the package.

8. The semiconductor device according to claim 7, wherein a thickness of the Cu film is within a range from about 10 µm to 50 µm, thickness of the first Au film and thickness of the second Au film are within a range from about 0.2 µm to 2 µm respectively and thickness of the first Ni film and thickness of the second Ni film are within a range from about 1 µm to 5 µm in the third electrode-lead.

9. The semiconductor device according to claim 7, wherein the second electrode-lead and the third electrode-lead are adjacent.

10. The semiconductor device according to claim 7, wherein a part of the semiconductor chip protrudes from the first electrode-lead.

11. The semiconductor device according to claim 7, wherein the part of the semiconductor chip protrudes laterally from the first electrode-lead toward the second electrode-lead and the third electrode-lead.

12. The semiconductor device according to claim 7, wherein the semiconductor chip is an insulating gate type field effect transistor.

* * * * *